US012772680B2

(12) United States Patent
Min et al.

(10) Patent No.: US 12,772,680 B2
(45) Date of Patent: Oct. 20, 2026

(54) DISPLAY DEVICE WITH A CONTACT PATTERN AND LINE HAVING PLURALITY OF OPENINGS

(71) Applicant: Samsung Display Co., Ltd., Yongin-Si (KR)

(72) Inventors: Junyoung Min, Yongin-si (KR); Jun-Yong An, Yongin-si (KR); Junwon Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 494 days.

(21) Appl. No.: 18/209,502

(22) Filed: Jun. 14, 2023

(65) Prior Publication Data

US 2024/0179972 A1 May 30, 2024

(30) Foreign Application Priority Data

Nov. 29, 2022 (KR) ........................ 10-2022-0162805

(51) Int. Cl.
*H10K 59/131* (2023.01)

(52) U.S. Cl.
CPC .................................. *H10K 59/131* (2023.02)

(58) Field of Classification Search
CPC .................................................... H10K 59/131
See application file for complete search history.

(56) References Cited

U.S. PATENT DOCUMENTS

| | | | | |
|---|---|---|---|---|
| 11,765,953 B2 * | 9/2023 | Lim | .................. | H10K 59/1315 345/204 |
| 2019/0006442 A1 * | 1/2019 | Byun | .................. | H10K 59/122 |
| 2019/0305010 A1 * | 10/2019 | Kim | .................. | H10D 86/0212 |
| 2020/0273940 A1 * | 8/2020 | Byun | .................. | G09G 3/3233 |
| 2020/0321421 A1 * | 10/2020 | Jeon | .................. | H10K 59/123 |
| 2020/0373375 A1 * | 11/2020 | Na | .................. | H10K 59/131 |
| 2021/0134877 A1 * | 5/2021 | Kim | .................. | H10H 29/142 |
| 2022/0115625 A1 | 4/2022 | Yu et al. | | |

FOREIGN PATENT DOCUMENTS

| | | |
|---|---|---|
| KR | 10-1160822 B1 | 6/2012 |
| KR | 10-2021-0032608 A | 3/2021 |
| KR | 10-2022-0034952 A | 3/2022 |
| KR | 10-2022-0047444 A | 4/2022 |
| KR | 10-2022-0075736 A | 6/2022 |

* cited by examiner

*Primary Examiner* — Lex H Malsawma
(74) *Attorney, Agent, or Firm* — Innovation Counsel LLP

(57) ABSTRACT

A display device includes a substrate defining a display area and a non-display area adjacent to the display area, a first line disposed in the non-display area on the substrate, a first via insulating layer disposed on the first line and defining an opening positioned on at least a portion of the first line, a second line disposed on the first via insulating layer and defining an opening pattern positioned on the first via insulating layer, and a second via insulating layer disposed on the second line and including a contact pattern positioned on at least a portion of the opening pattern of the second line.

20 Claims, 17 Drawing Sheets

DISPLAY DEVICE WITH A CONTACT PATTERN AND LINE HAVING PLURALITY OF OPENINGS

CROSS-REFERENCE TO RELATED APPLICATION(S)

This application claims priority under 35 USC § 119 to Korean Patent Application No. 10-2022-0162805 filed on Nov. 29, 2022, in the Korean Intellectual Property Office (KIPO), the entire disclosure of which is incorporated by reference herein.

BACKGROUND

1. Field

The present disclosure relates to a display device.

2. Description of the Related Art

A display device is a device that displays an image to provide visual information to a user. Among the different types of display devices, an organic light emitting diode display device has recently been attracting attention.

The display device may include an inorganic insulating layer and/or an organic insulating layer for insulating between stacked conductive layers. Due to short-term or long-term chemical decomposition of organic material included in the organic insulating layer, the organic insulating layer may generate gas.

SUMMARY

Embodiments provide a display device with improved display quality.

A display device according to an embodiment of the present disclosure includes a substrate defining a display area and a non-display area adjacent to the display area, a first line disposed in the non-display area on the substrate, a first via insulating layer disposed on the first line and defining an opening positioned on at least a portion of the first line, a second line disposed on the first via insulating layer and defining an opening pattern positioned on the first via insulating layer, and a second via insulating layer disposed on the second line and including a contact pattern positioned on at least a portion of the opening pattern of the second line.

In an embodiment, the opening defined in the first via insulating layer in the non-display area may be positioned on the first line.

In an embodiment, the second via insulating layer may fill the opening pattern.

In an embodiment, the second via insulating layer may contact the first via insulating layer in the opening pattern.

In an embodiment, the second line may be positioned on at least a portion of the first line.

In an embodiment, the second line may contact the first line through the opening defined in the first via insulating layer.

In an embodiment, the display device may further include a fan-out line disposed in the non-display area on the substrate and positioned on the first line.

In an embodiment, the fan-out line may include a first fan-out line, and a second fan-out line disposed on the first fan-out line and spaced apart from the first fan-out line in plan view.

In an embodiment, the display device may further include a common electrode disposed on the second via insulating layer.

In an embodiment, the common electrode may contact the second line through the contact pattern defined in the second via insulating layer.

A display device according to an embodiment of the present disclosure includes a substrate defining a display area and a non-display area adjacent to the display area, a plurality of fan-out lines disposed in the non-display area on the substrate, a first power supply line disposed on the plurality of fan-out lines and positioned on at least a portion of the plurality of fan-out lines, a first via insulating layer disposed on the first power supply line and defining an opening that is positioned on at least a portion of the first power supply line, a second power supply line disposed on the first via insulating layer and defining an opening pattern positioned on the first via insulating layer, and a second via insulating layer disposed on the second power supply line and including a contact pattern positioned on at least a portion of the opening pattern of the second power supply line.

In an embodiment, the plurality of fan-out lines may include a first fan-out line, a second fan-out line disposed on the first fan-out line, and a third fan-out line disposed on the second fan-out line.

In an embodiment, the first, second and third fan-out lines may be spaced apart from each other in plan view.

In an embodiment, the display device may further include an insulating layer disposed between the third fan-out line and the first power supply line.

In an embodiment, the insulating layer may include an organic insulating material.

In an embodiment, the opening defined in the first via insulating layer in the non-display area may be positioned on the first power supply line.

In an embodiment, the second via insulating layer may fill the opening pattern.

In an embodiment, the second via insulating layer may contact the first via insulating layer in the opening pattern.

In an embodiment, the second power supply line may be positioned on at least a portion of the first power supply line.

In an embodiment, the second power supply line may contact the first power supply line through the opening defined in the first via insulating layer.

In a display device according to embodiments of the present disclosure, the display device may include a first power supply line, a first via insulating layer defining an opening, a second power supply line defining an opening pattern and a second via insulating layer including a contact pattern. The second power supply line may not entirely overlap the first power supply line. That is, the second power supply line may also be disposed in an area where the first power supply line is not disposed, and may have a relatively large area. Accordingly, a power voltage may be sufficiently supplied through the second power supply line. In addition, since the second power supply line defines the opening pattern, gas generated in the first via insulating layer may be discharged, and damage to a light emitting element due to the gas may be prevented. In addition, since the first via insulating layer having a relatively thicker thickness than an inorganic insulating layer is disposed between the second power supply line and a fan-out line, a distance between the second power supply line and the fan-out line may be relatively large. Accordingly, parasitic capacitance may be prevented, and influence (e.g., touch or noise) of the second power supply line on the fan-out line may be reduced.

DETAILED DESCRIPTION OF THE EMBODIMENTS

Figure 1:
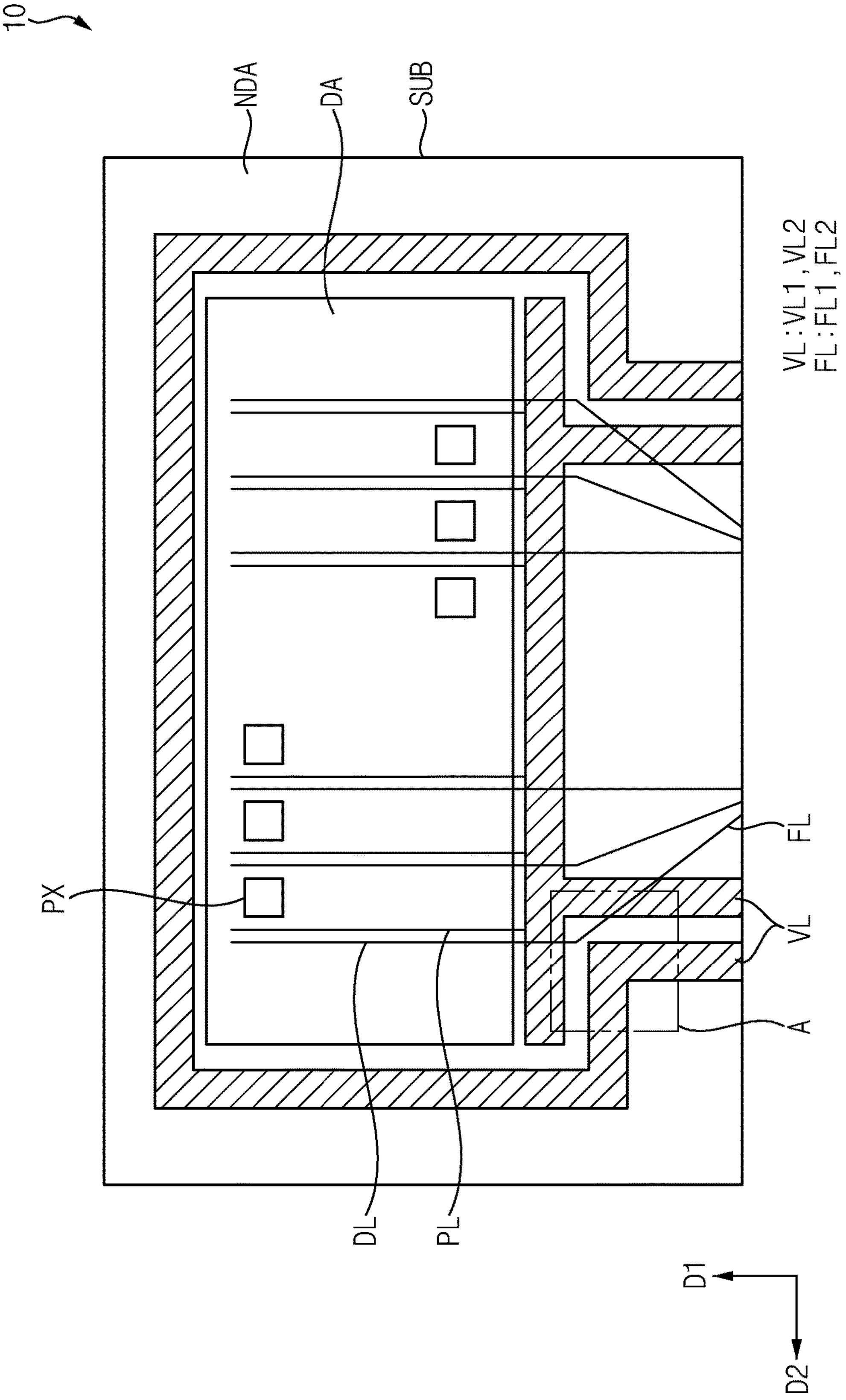
FIG. 1 is a plan view illustrating a display device according to an embodiment of the present disclosure.

Hereinafter, embodiments of the present disclosure will be described in more detail with reference to the accompanying drawings. The same reference numerals are used for the same components in the drawings, and redundant descriptions of the same components will be omitted.

FIG. 1 is a plan view illustrating a display device according to an embodiment of the present disclosure.

Referring to FIG. 1, a display device 10 may include a display area DA and a non-display area NDA adjacent to the display area DA.

The display area DA may be an area capable of displaying an image by generating light, and the non-display area NDA may be an area not displaying an image.

A plurality of pixels PX that emits light may be disposed in the display area DA, and accordingly, an image may be displayed in the display area DA. The pixels PX may be arranged in a matrix form along a first direction D1 and a second direction D2 crossing the first direction D1. For example, the second direction D2 may be perpendicular to the first direction D1. Each of the pixels PX may include a light emitting element and a pixel circuit for driving the light emitting element. In an embodiment, the light emitting element may include an organic light emitting diode, and the pixel circuit may include at least one thin film transistor.

Lines for providing signals or power to the pixels PX may be disposed in the display area DA. For example, a plurality of data lines DL and a plurality of power voltage lines PL may be disposed in the display area DA.

Each of the data lines DL may extend along the first direction D1, and may be arranged along the second direction D2. The data lines DL may supply a data voltage to each of the pixels PX. Each of the power voltage lines PL may extend parallel to the data lines DL along the first direction D1, and may be arranged along the second direction D2. The power voltage lines PL may supply a power voltage to each of the pixels PX.

The non-display area NDA may surround at least a portion of the display area DA. For example, the non-display area NDA may entirely surround the display area DA. Power supply lines, drivers, and the like for displaying an image of the display area DA may be disposed in the non-display area NDA. For example, a power supply line VL that provides the power voltage to the power voltage lines PL and a fan-out line FL that transmits data signals to the data lines DL may be disposed in the non-display area NDA. The power supply line VL may include a first power supply line VL1 and a second power supply line VL2, and the fan-out line FL may include a first fan-out line FL1 and a second fan-out line FL2.

FIGS. 2, 3, 4, 5, 6, and 7 are enlarged layout views of area A of FIG. 1. For example, FIGS. 2, 3, 4, 5, 6, and 7 may be enlarged layout views of the fan-out line FL and the power supply line VL in the non-display area NDA.

Figure 2:
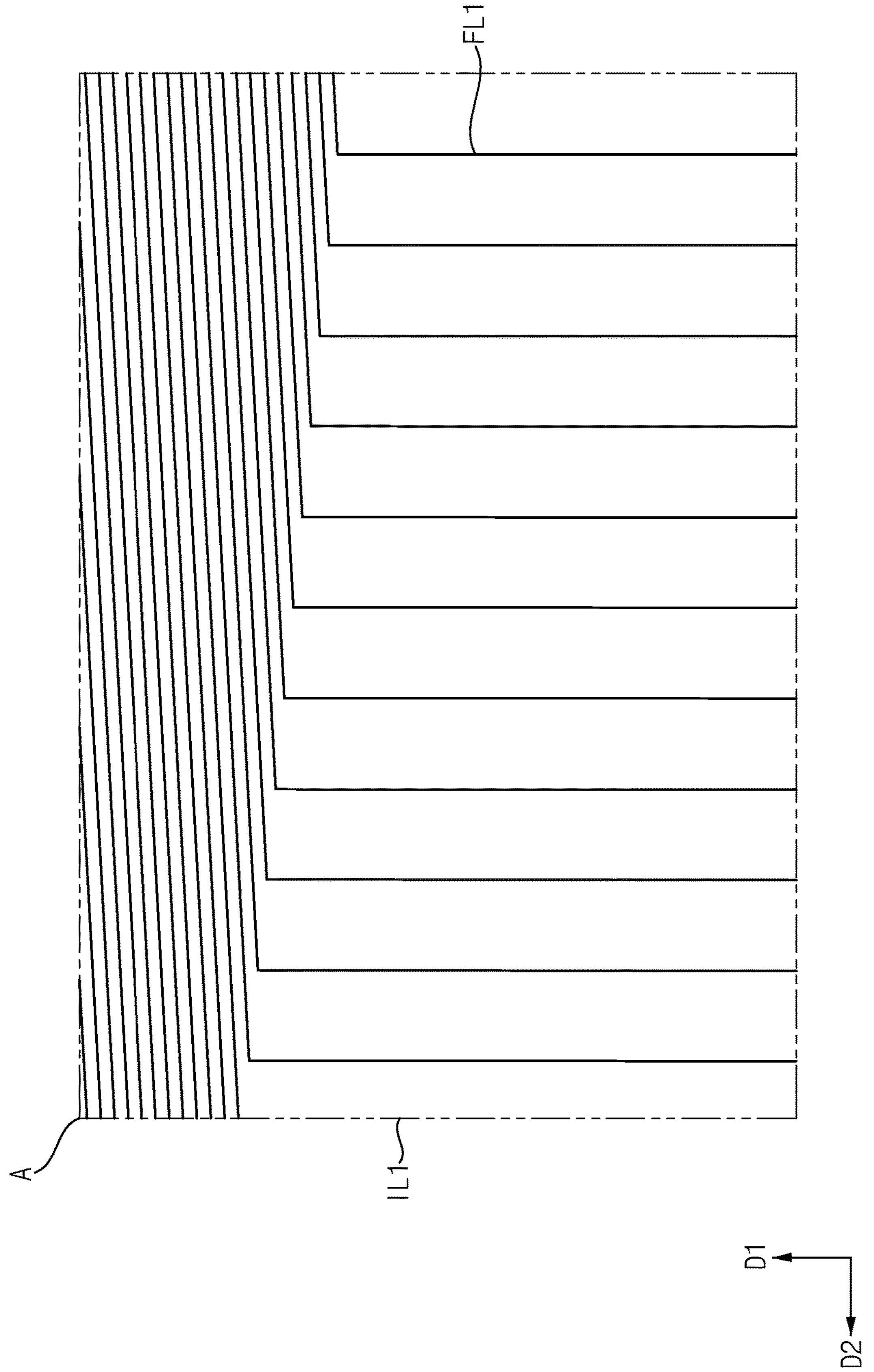
FIGS. 2, 3, 4, 5, 6, and 7 are enlarged layout views of area A of FIG. 1.

Referring to FIGS. 1 and 2, a first insulating layer IL1 and the first fan-out line FL1 may be sequentially disposed on a substrate SUB.

The substrate SUB may include a transparent or opaque material. Examples of materials that may be used as the substrate SUB may include glass, quartz, plastic, and the like. These may be used alone or in combination with each other.

The first insulating layer IL1 may be disposed on the substrate SUB. The first insulating layer IL1 may include an inorganic insulating material. Examples of inorganic insulating materials that may be used as the first insulating layer IL1 may include silicon oxide, silicon nitride, silicon oxynitride, and the like. These may be used alone or in combination with each other.

The first fan-out line FL1 may be disposed on the first insulating layer ILL. The first fan-out line FL1 may extend in the first direction D1 or in an oblique direction crossing the first direction D1. The first fan-out line FL1 may include a conductive material. Examples of conductive materials that may be used as the first fan-out line FL1 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like. These may be used alone or in combination with each other.

Figure 3:
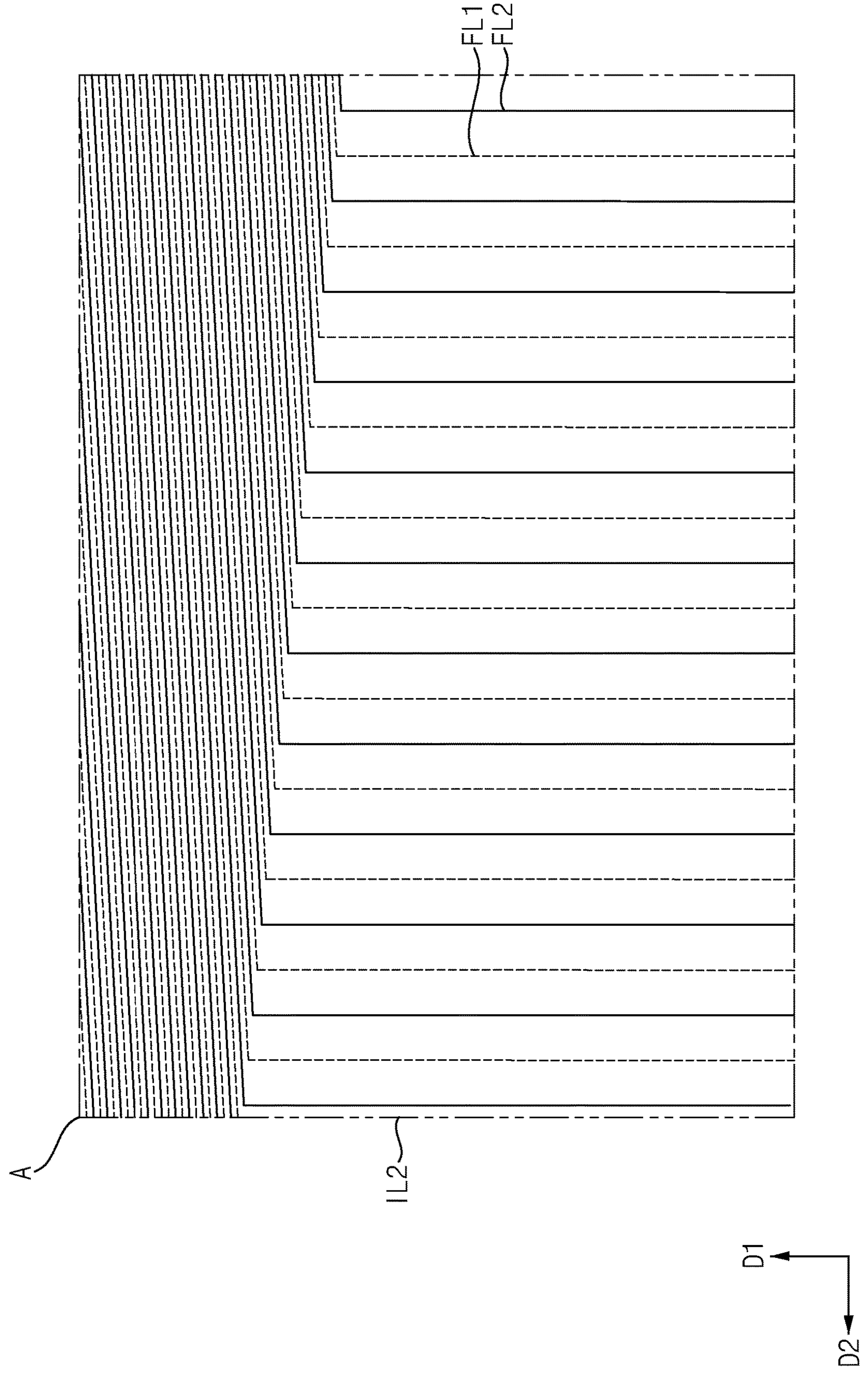

Referring to FIGS. 2 and 3, a second insulating layer IL2 and the second fan-out line FL2 may be sequentially disposed on the first fan-out line FL1.

The second insulating layer IL2 may be disposed on the first fan-out line FL1, and may cover the first fan-out line FL1. The second insulating layer IL2 may include an inorganic insulating material. Examples of inorganic insulating materials that may be used as the second insulating layer IL2 may include silicon oxide, silicon nitride, silicon oxynitride, and the like. These may be used alone or in combination with each other.

The second fan-out line FL2 may be disposed on the second insulating layer IL2. The second fan-out line FL2 may extend in the first direction D1 or in an oblique direction crossing the first direction D1. The second fan-out line FL2 may be spaced apart from the first fan-out line FL1 on a plane. That is, the second fan-out line FL2 and the first fan-out line FL1 may not overlap. The second fan-out line FL2 may include a conductive material. Examples of conductive materials that may be used as the second fan-out line FL2 may include aluminum, platinum, palladium, silver, magnesium, gold, nickel, neodymium, iridium, chromium, lithium, calcium, molybdenum, titanium, tungsten, copper, and the like. These may be used alone or in combination with each other.

Figure 4:
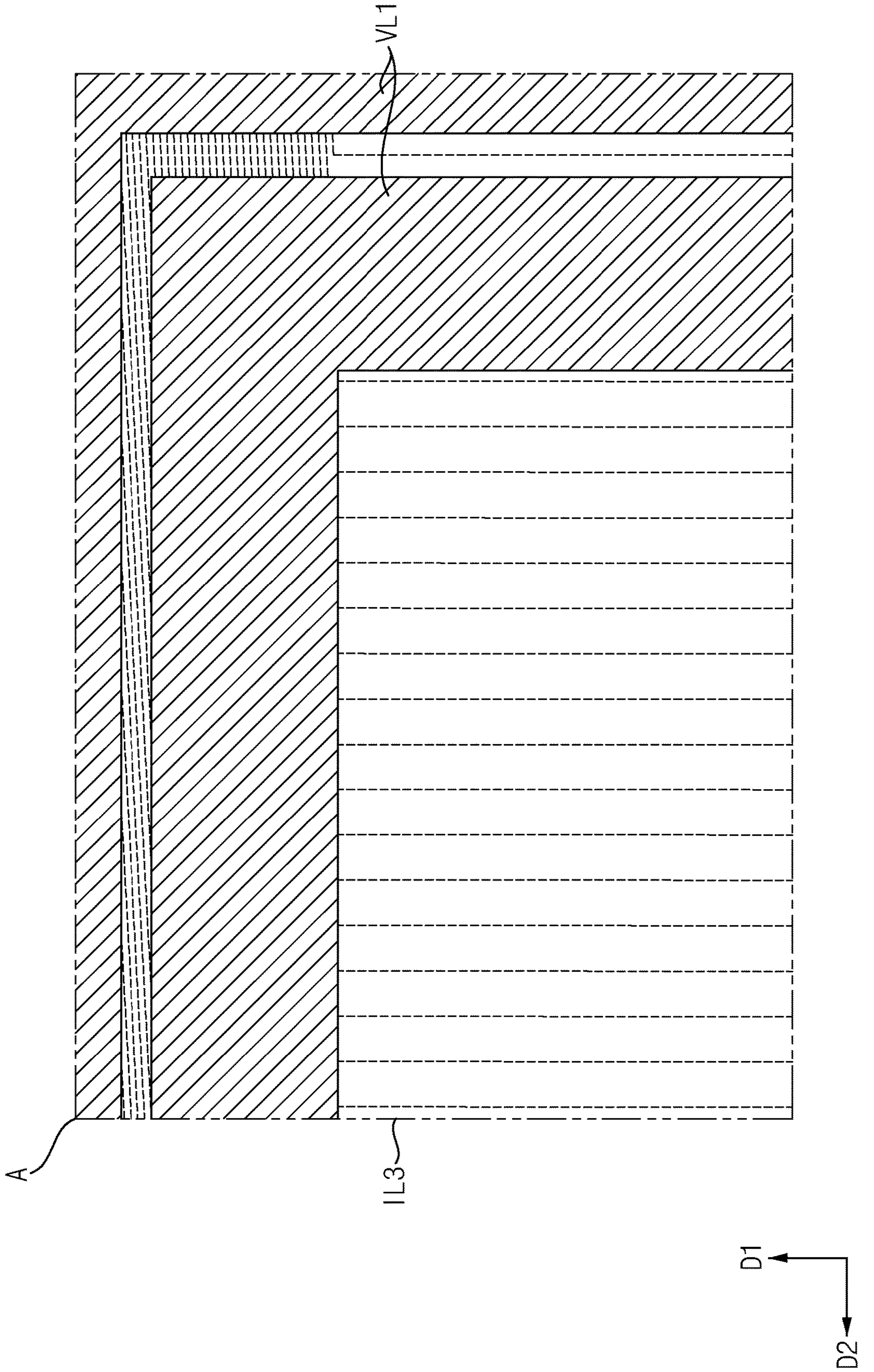

Referring to FIGS. 3 and 4, a third insulating layer IL3 and the first power supply line VL1 may be sequentially disposed on the second fan-out line FL2.

The third insulating layer IL3 may be disposed on the second fan-out line FL2, and may cover the second fan-out line FL2. The third insulating layer IL3 may include an inorganic insulating material. Examples of inorganic insulating materials that may be used as the third insulating layer IL3 may include silicon oxide, silicon nitride, silicon oxynitride, and the like. These may be used alone or in combination with each other. The first insulating layer IL1, the second insulating layer IL2, and the third insulating layer IL3 may be made of the same material or different materials.

The first power supply line VL1 may be disposed on the third insulating layer IL3. The first power supply line VL1 may cover the first fan-out line FL1 and the second fan-out line FL2. The first power supply line VL1 may extend in the first direction D1 or in the second direction D2. The first power supply line VL1 may include a conductive material. Examples of conductive materials that may be used as the first power supply line VL1 may include aluminum, platinum, palladium, silver, magnesium, gold, nickel, neodymium, iridium, chromium, lithium, calcium, molybdenum, titanium, tungsten, copper, and the like. These may be used alone or in combination with each other.

Figure 5:
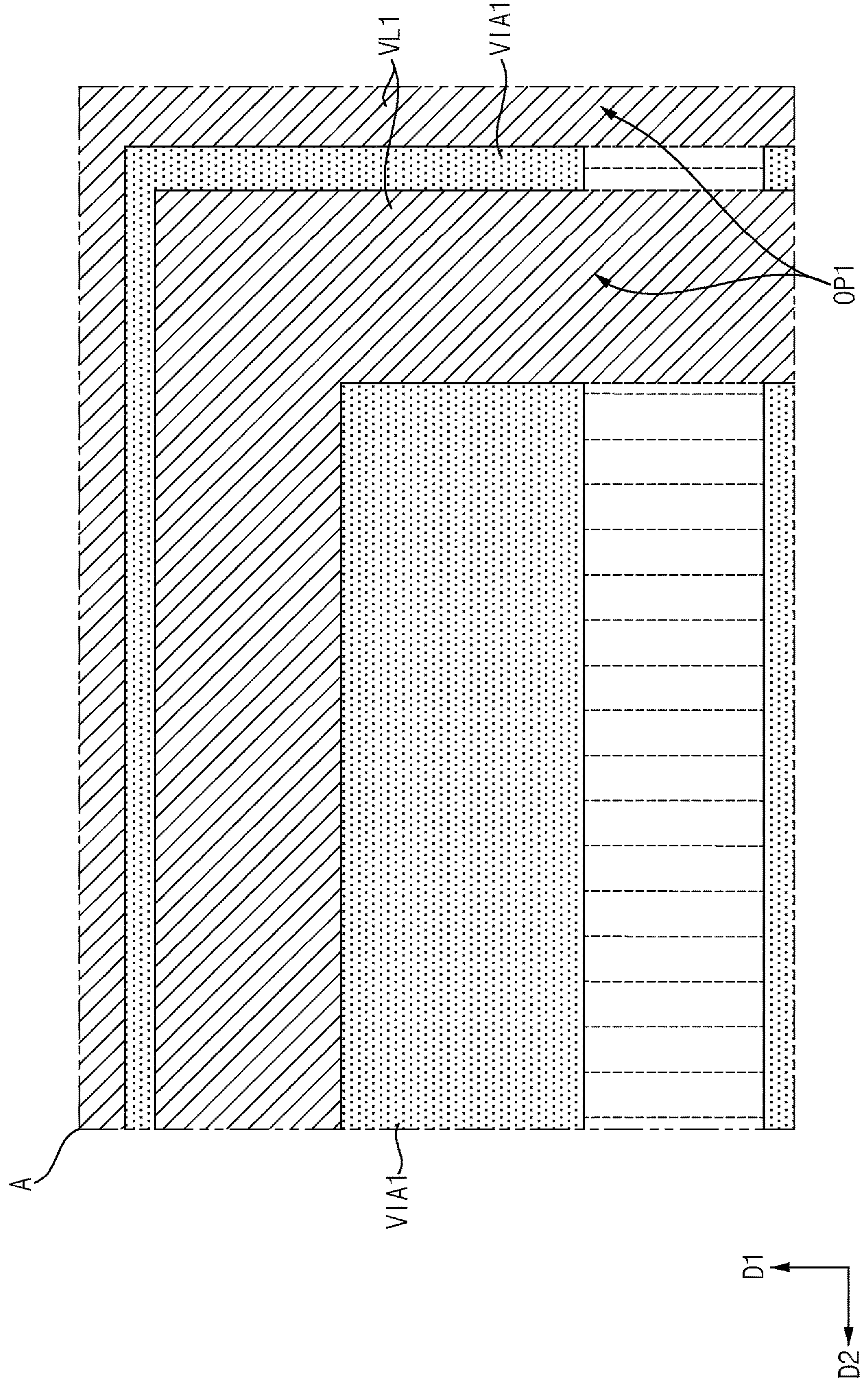

Referring to FIGS. 4 and 5, a first via insulating layer VIA1 may be disposed on the third insulating layer IL3 and the first power supply line VL1 (that state is not depicted in the figures). Apart of the first via insulating layer VIA1 may be removed to define an opening OP1 exposing at least a portion of the first power supply line VL1, as depicted in FIG. 5. The opening OP1 may be formed along the first power supply line VL1. For example, the opening OP1 defined in the first via insulating layer VIA1 in the non-display area NDA may overlap the first power supply line VL1 on the plane. In addition, the first via insulating layer VIA1 may contact at least a portion of the third insulating layer IL3.

The first via insulating layer VIA1 may include an organic insulating material. Examples of organic insulating materials that may be used as the first via insulating layer VIA1 may include photoresist, polyacrylic resin, polyimide resin, acrylic resin, and the like. These may be used alone or in combination with each other.

Figure 6:
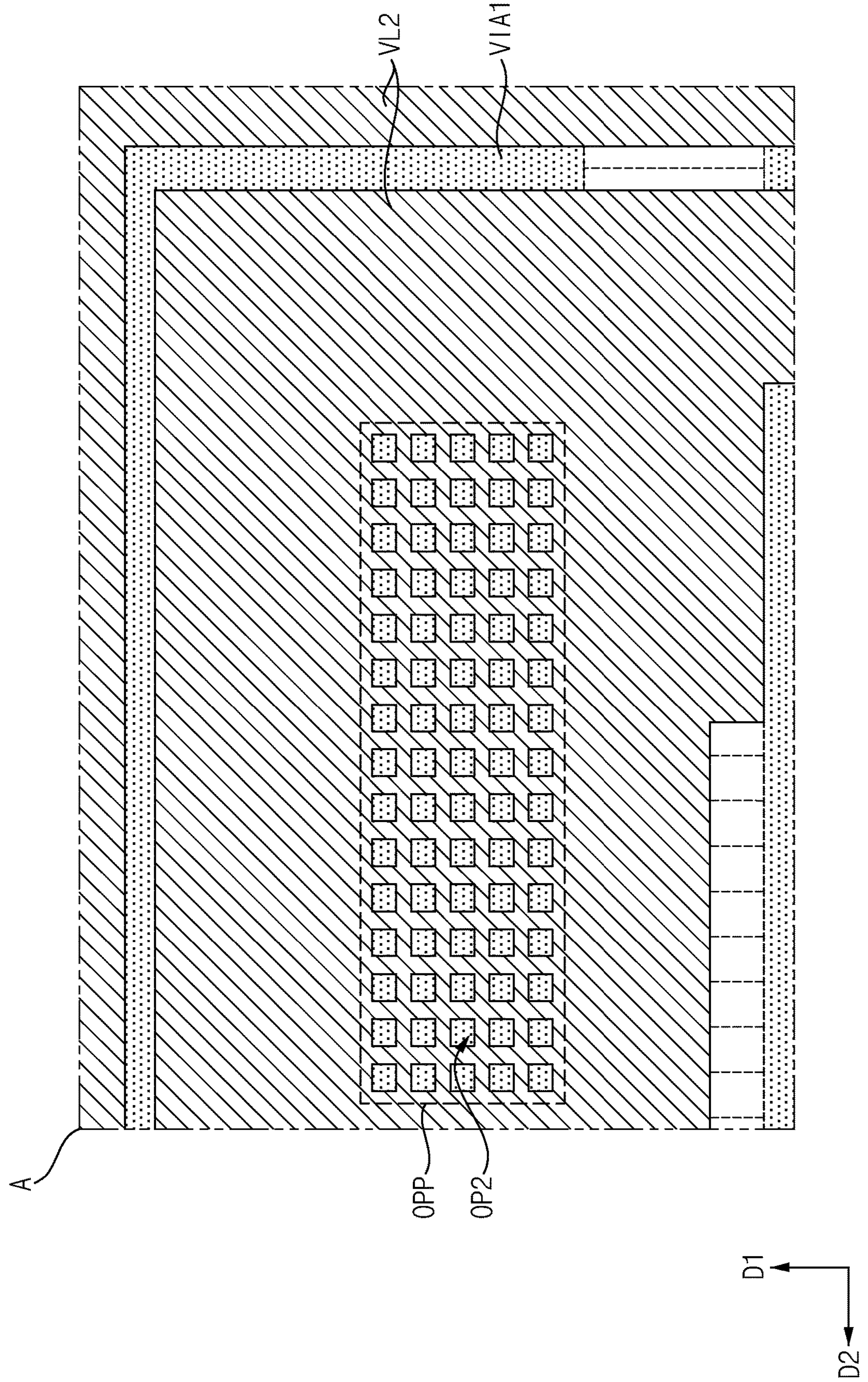

Referring to FIGS. 5 and 6, the second power supply line VL2 may be disposed on the first via insulating layer VIA1.

The second power supply line VL2 may cover at least a portion of the first via insulating layer VIAL. In an embodiment, the second power supply line VL2 may define an opening pattern OPP exposing the first via insulating layer VIA1 in an area overlapping the first via insulating layer VIA1. The opening pattern OPP may define a plurality of openings OP2. For example, the plurality of openings OP2 may be disposed along the first direction D1 and the second direction D2.

Since the first via insulating layer VIA1 includes an organic insulating material, gas may be generated in the first via insulating layer VIA1 through short-term or long-term chemical decomposition. When the gas is not properly discharged, the light emitting element disposed in the display area DA may be damaged by the gas, thereby causing pixel shrinkage and a decrease in lifespan of the light emitting element.

As the second power supply line VL2 defines the opening pattern OPP, the gas generated in the first via insulating layer VIA1 may be discharged through the opening pattern OPP.

In addition, the second power supply line VL2 may cover at least a portion of the first power supply line VL1. For example, the second power supply line VL2 may contact the first power supply line VL1 through the opening OP1 defined in the first via insulating layer VIA1.

The second power supply line VL2 may include a conductive material. Examples of the conductive material that may be used as the second power supply line VL2 may include aluminum, platinum, palladium, silver, magnesium, gold, nickel, neodymium, iridium, chromium, lithium, calcium, molybdenum, titanium, tungsten, copper, and the like. These may be used alone or in combination with each other.

Figure 7:
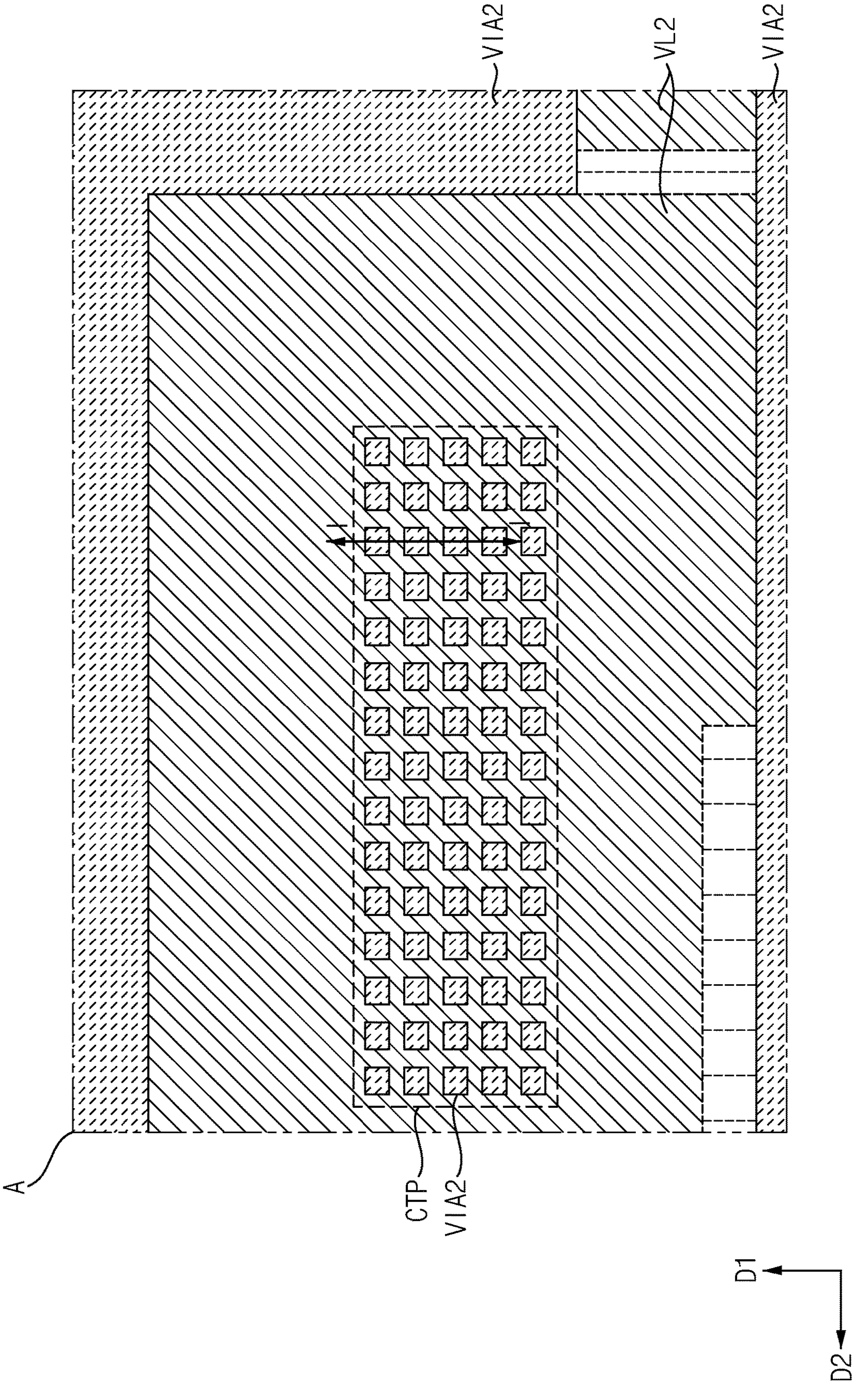

Referring to FIGS. 6 and 7, a second via insulating layer VIA2 may be disposed on the second power supply line VL2.

The second via insulating layer VIA2 may cover at least a portion of each of the first via insulating layer VIA1 and the second power supply line VL2.

Parts of the second via insulating layer VIA2 may be selectively removed. In an embodiment, the second via insulating layer VIA2 may include a contact pattern CTP overlapping at least a portion of the opening pattern OPP defined in the second power supply line VL2. For example, the second via insulating layer VIA2 may fill the opening pattern OPP of the second power supply line VL2 through the contact pattern CTP. That is, the second via insulating layer VIA2 may contact the first via insulating layer VIA1 in the opening pattern OPP. The contact pattern CTP may be spaced apart from portions of the second via insulating layer VIA2 other than the contact pattern CTP.

Figure 8:
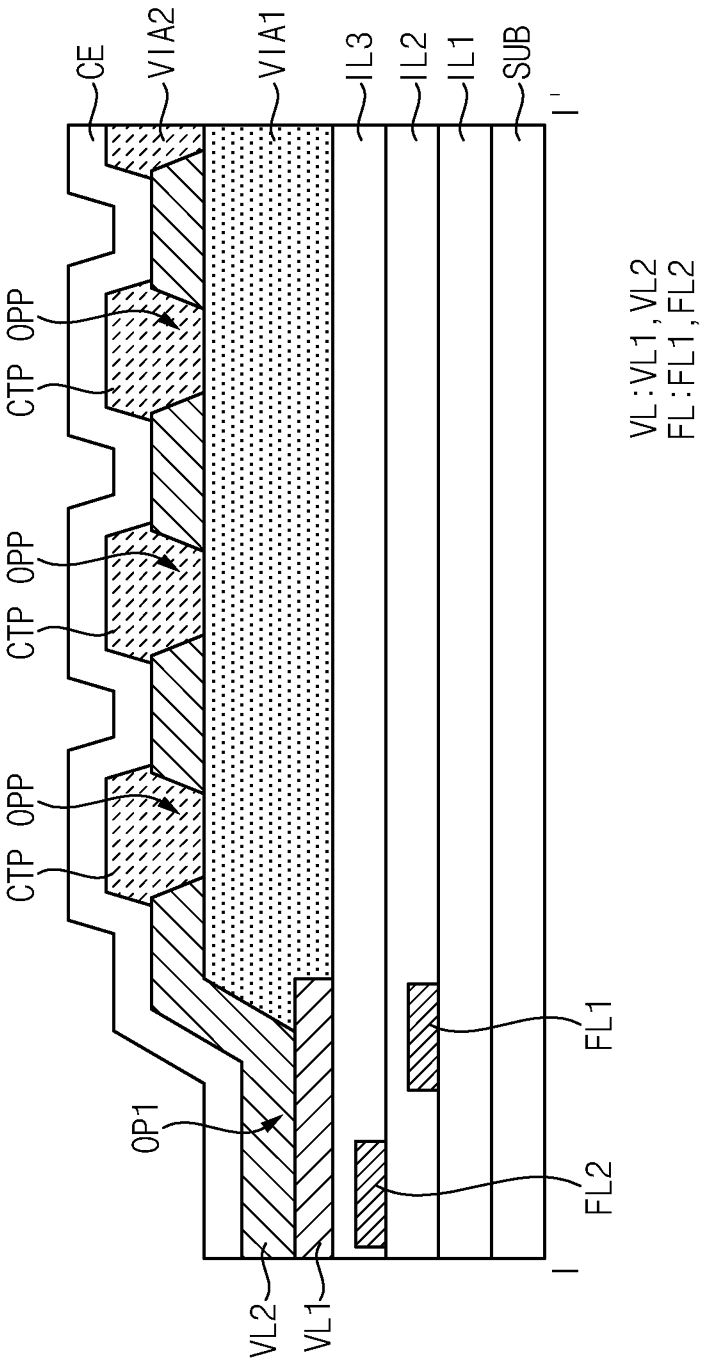
FIG. 8 is a cross-sectional view taken along line I-I' of FIG. 7.

In the embodiment depicted in FIG. 8, the portions of the second via insulating layer VIA2 that are removed are above the second power supply line VL2. In this embodiment, the common electrode CE contacts the second power supply line VL2 in spaces between the contact pattern CTP.

The second via insulating layer VIA2 may include an organic insulating material. Examples of organic insulating materials that may be used as the second via insulating layer VIA2 may include photoresist, polyacrylic resin, polyimide resin, acrylic resin, and the like. These may be used alone or in combination with each other.

FIG. 8 is a cross-sectional view taken along line I-I' of FIG. 7.

Referring to FIG. 8, the display device 10 may include the substrate SUB, the first insulating layer IL1, the first fan-out line FL1, the second insulating layer IL2, the second fan-out line FL2, the third insulating layer IL3, the first power supply line VL1, the first via insulating layer VIA1, the second power supply line VL2, the second via insulating layer VIA2 and a common electrode CE.

Hereinafter, descriptions of the display device 10 already provided above with reference to FIGS. 2, 3, 4, 5, 6 and 7 will be omitted or simplified.

The first insulating layer IL1, the first fan-out line FL1, the second insulating layer IL2, the second fan-out line FL2 and the third insulating layer IL3 may be sequentially disposed on the substrate SUB. The first fan-out line FL1 and the second fan-out line FL2 may be spaced apart from each other.

The first power supply line VL1 and the first via insulating layer VIA1 may be sequentially disposed on the third insulating layer IL3. The opening OP1 exposing at least a portion of the first power supply line VL1 may be defined in the first via insulating layer VIA1.

The second power supply line VL2 may be disposed on the first via insulating layer VIA1. The second power supply line VL2 may define the opening pattern OPP exposing at least a portion of the first via insulating layer VIA1. The second power supply line VL2 may contact the first power supply line VL1 in the opening OP1 of the first via insulating layer VIA1.

The second via insulating layer VIA2 may be disposed on the second power supply line VL2. The second via insulating layer VIA2 may include the contact pattern CTP overlapping at least a portion of the opening pattern OPP. The contact pattern CTP may contact the first via insulating layer VIA1. That is, the second via insulating layer VIA2 may contact the first via insulating layer VIA1 in the opening pattern OPP. The contact pattern CTP may cover at least a portion of the second power supply line VL2 adjacent to openings (e.g., the openings OP2 of FIG. 6) of the opening pattern OPP. Accordingly, corrosion of the second power supply line VL2 from the opening pattern OPP may be prevented.

The common electrode CE may be disposed on the second via insulating layer VIA2. The common electrode CE may be a plate electrode. The common electrode CE may contact the second power supply line VL2 exposed by the second via insulating layer VIA2. In other words, the common electrode CE may contact the second power supply line VL2 that is not covered by the contact pattern CTP of the second via insulating layer VIA2.

The common electrode CE may include a conductive material. Examples of conductive materials that may be used as the common electrode CE may include aluminum, platinum, silver, magnesium, gold, chromium, tungsten, titanium, and the like. These may be used alone or in combination with each other.

The display device 10 according to an embodiment of the present disclosure may include the first power supply line VL1, the first via insulating layer VIA1 defining the opening OP1, the second power supply line VL2 defining the opening pattern OPP and the second via insulating layer VIA2 including the contact pattern CTP. The second power supply line VL2 may not entirely overlap the first power supply line VL1. That is, the second power supply line VL2 may also be disposed in an area where the first power supply line VL1 is not disposed. The second power supply line VL2 may have a relatively large area. In addition, the second power supply line VL2 may overlap and extend with the first via insulating layer VIA1 and the first power supply line VL1 in the first direction D1. Accordingly, the power voltage may be sufficiently supplied through the second power supply line VL2. In addition, since the second power supply line VL2 defines the opening pattern OPP, the gas generated in the first via insulating layer VIA1 may be discharged, and damage to the light emitting element due to the gas may be prevented. In addition, since the first via insulating layer VIA1 having a relatively thicker thickness than the inorganic insulating layers IL1, IL2 and IL3 is disposed between the second power supply line VL2 and the fan-out line FL, a distance between the second power supply line VL2 and the fan-out line FL may be relatively large. Accordingly, parasitic capacitance may be prevented, and influence (e.g., touch or noise) of the second power supply line VL2 on the fan-out line FL may be prevented.

Figure 9:
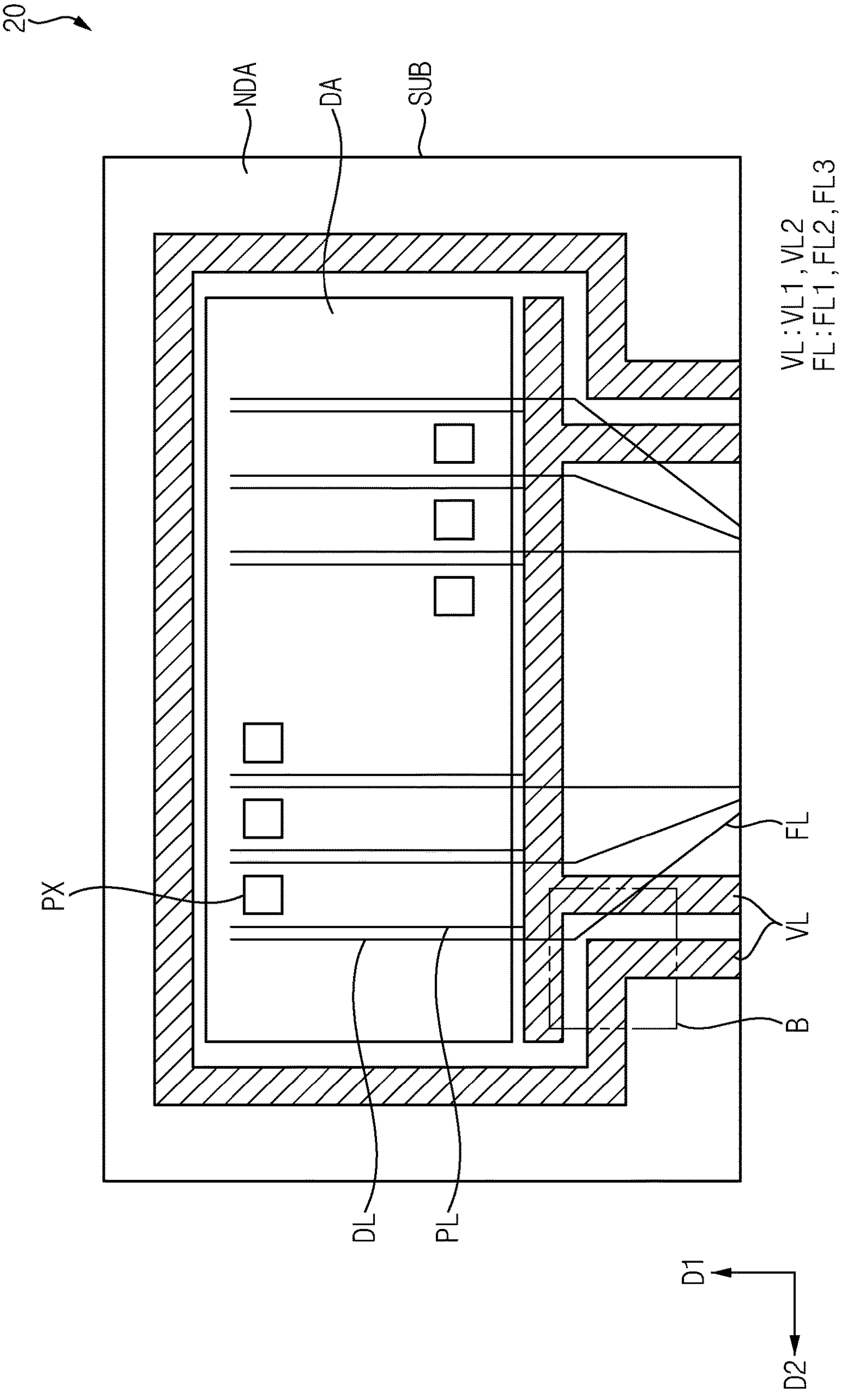
FIG. 9 is a plan view illustrating a display device according to another embodiment of the present disclosure.
Figure 10:
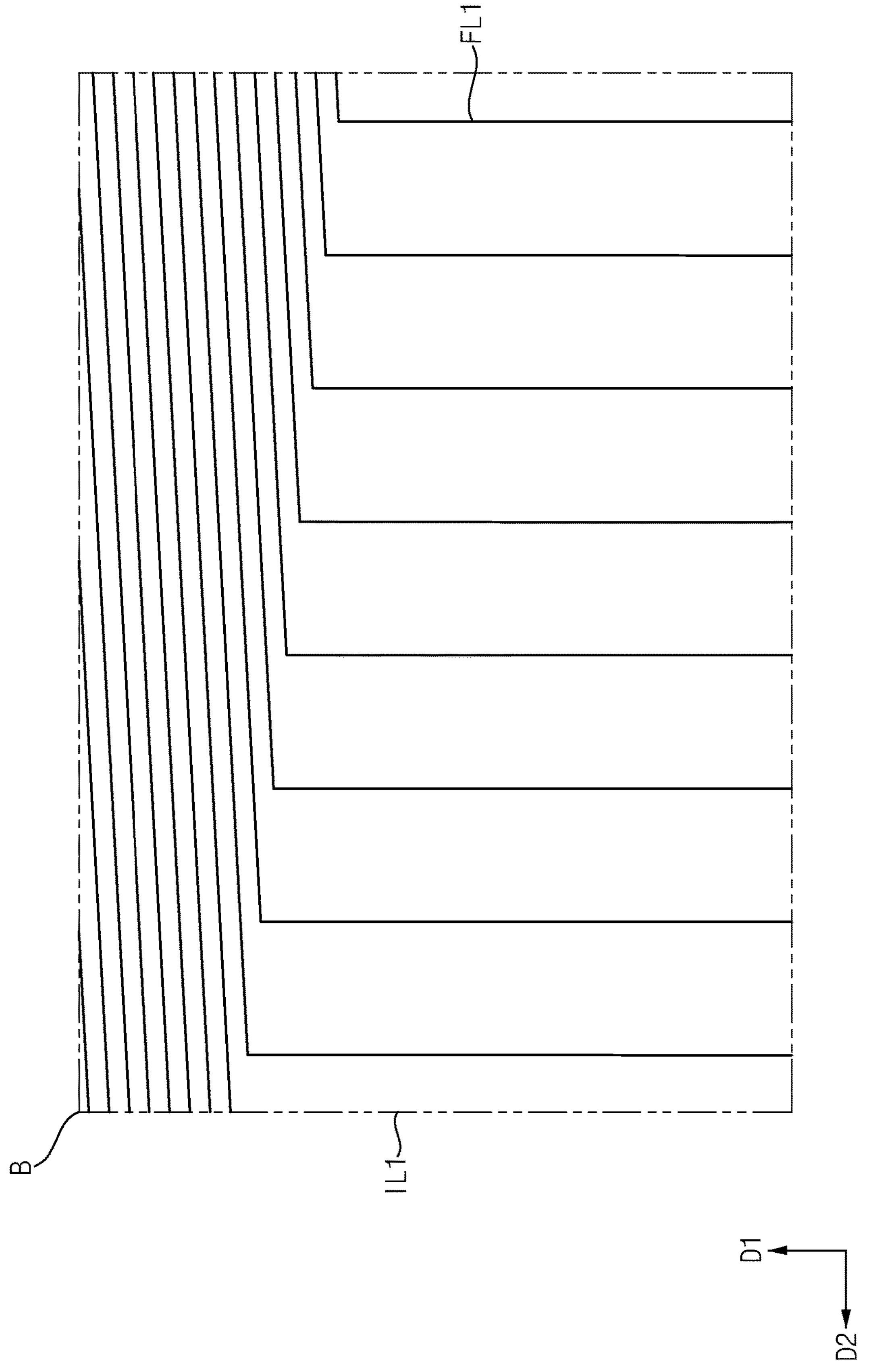
FIGS. 10, 11, 12, 13, 14, 15 and 16 are enlarged layout views of area B of FIG. 9.
Figure 11:
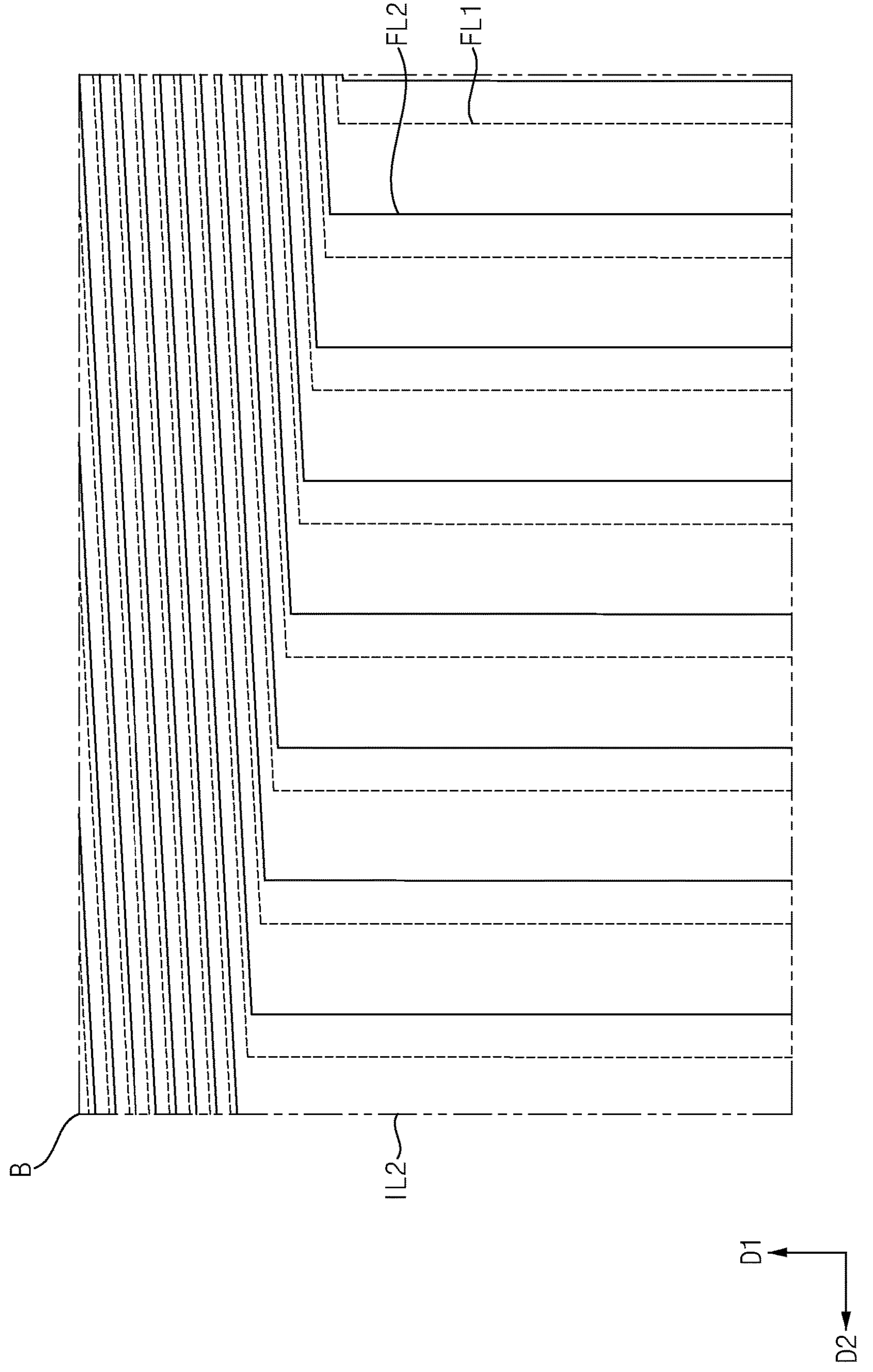

FIG. 9 is a plan view illustrating a display device according to another embodiment of the present disclosure. Hereinafter, redundant descriptions of the display device 10 provided with reference to FIG. 1 will be omitted or simplified.

Referring to FIG. 9, a display device 20 may include a display area DA and a non-display area NDA adjacent to the display area DA.

Power supply lines, drivers, and the like may be disposed in the non-display area NDA. For example, a power supply line VL that provides a power voltage to power voltage lines PL and a fan-out line FL that transmits data signals to data lines DL may be disposed in the non-display area NDA. The power supply line VL may include a first power supply line VL1 and a second power supply line VL2, and the fan-out line FL may include a first fan-out line FL1, a second fan-out line FL2 and a third fan-out line FL3.

FIGS. 10, 11, 12, 13, 14, 15 and 16 are enlarged layout views of area B of FIG. 9. For example, FIGS. 10, 11, 12, 13, 14, 15 and 16 may be enlarged layout views of the fan-out line FL and the power supply line VL in the non-display area NDA.

Hereinafter, descriptions overlapping those of the display device 10 described with reference to FIGS. 2, 3, 4, 5, 6, 7 and 8 will be omitted or simplified.

Referring to FIGS. 9, 10, 11 and 12, a first insulating layer IL1, the first fan-out line FL1, a second insulating layer IL2, a third insulating layer IL3 and the third fan-out line FL3 may be sequentially disposed on a substrate SUB.

The third fan-out line FL3 may be disposed on the third insulating layer IL3. The third fan-out line FL3 may extend in the first direction D1 or in an oblique direction crossing the first direction D1. The third fan-out line FL3 may be spaced apart from each of the first fan-out line FL1 and the second fan-out line FL2 on a plane. In other words, the first fan-out line FL1, the second fan-out line FL2 and the third fan-out line FL3 may be spaced apart from each other on the plane. That is, the first fan-out line FL1, the second fan-out line FL2 and the third fan-out line FL3 may not overlap each other. The third fan-out line FL3 may include a conductive material. Examples of conductive materials that may be used as the third fan-out line FL3 may include aluminum, platinum, palladium, silver, magnesium, gold, nickel, neodymium, iridium, chromium, lithium, calcium, molybdenum, titanium, tungsten, copper, and the like. These may be used alone or in combination with each other.

Figure 12:
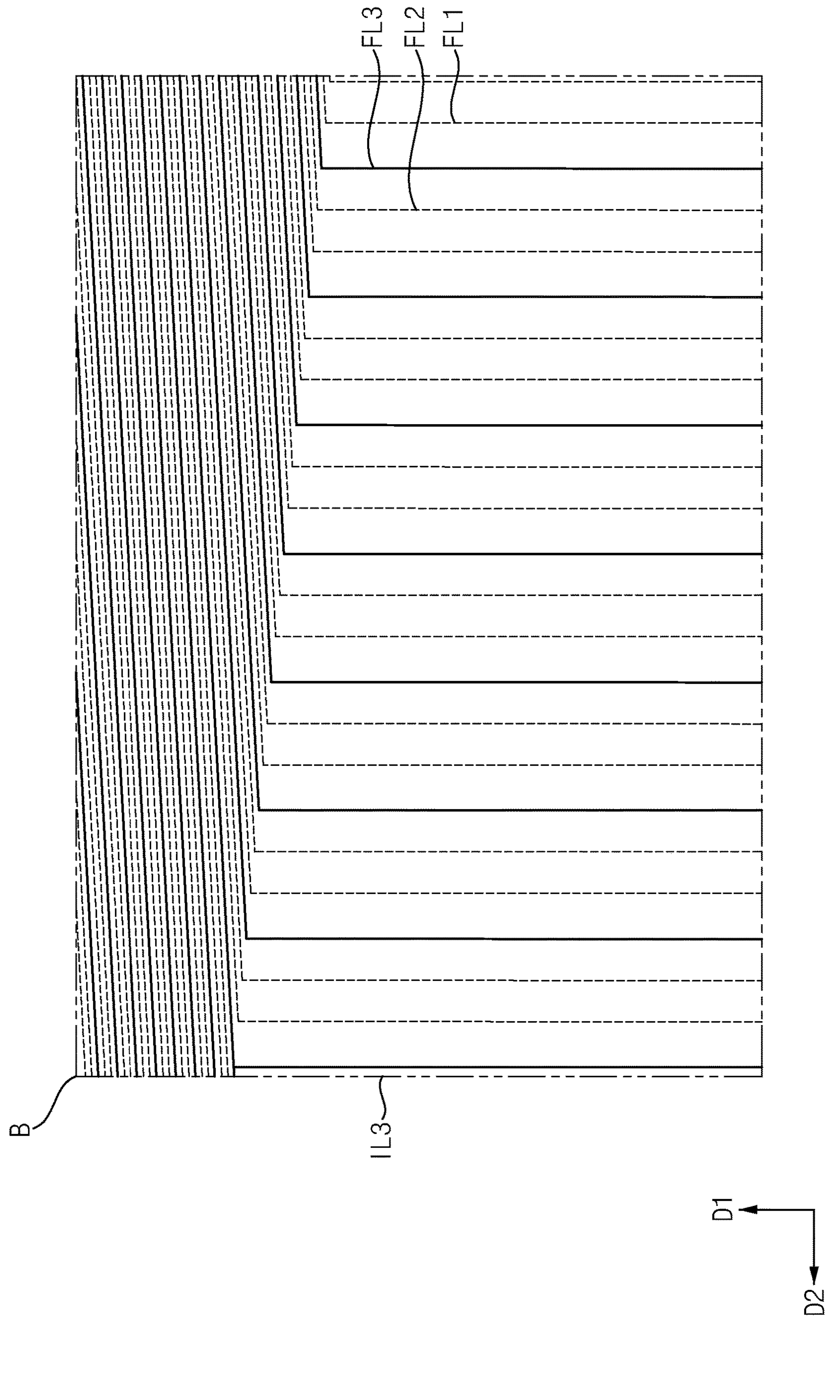
Figure 13:
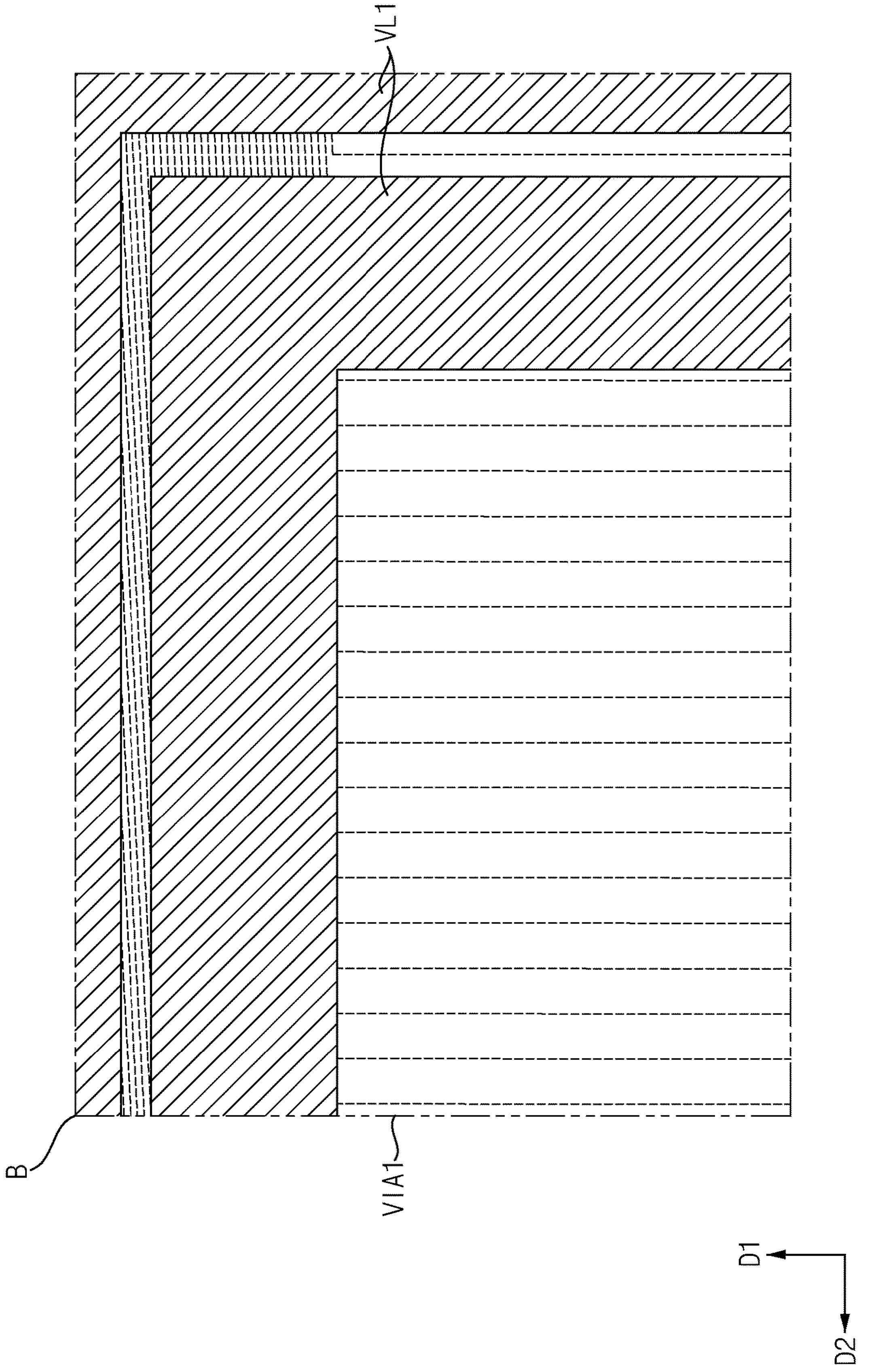

Referring to FIGS. 12 and 13, a first via insulating layer VIA1 and the first power supply line VL1 may be sequentially disposed on the third fan-out line FL3.

The first via insulating layer VIA1 may be disposed on the third fan-out line FL3, and may cover the third fan-out line FL3. The first via insulating layer VIA1 may include an organic insulating material.

The first power supply line VL1 may be disposed on the first via insulating layer VIA1. The first power supply line VL1 may overlap the first fan-out line FL1, the second fan-out line FL2 and the third fan-out line FL3.

Figure 14:
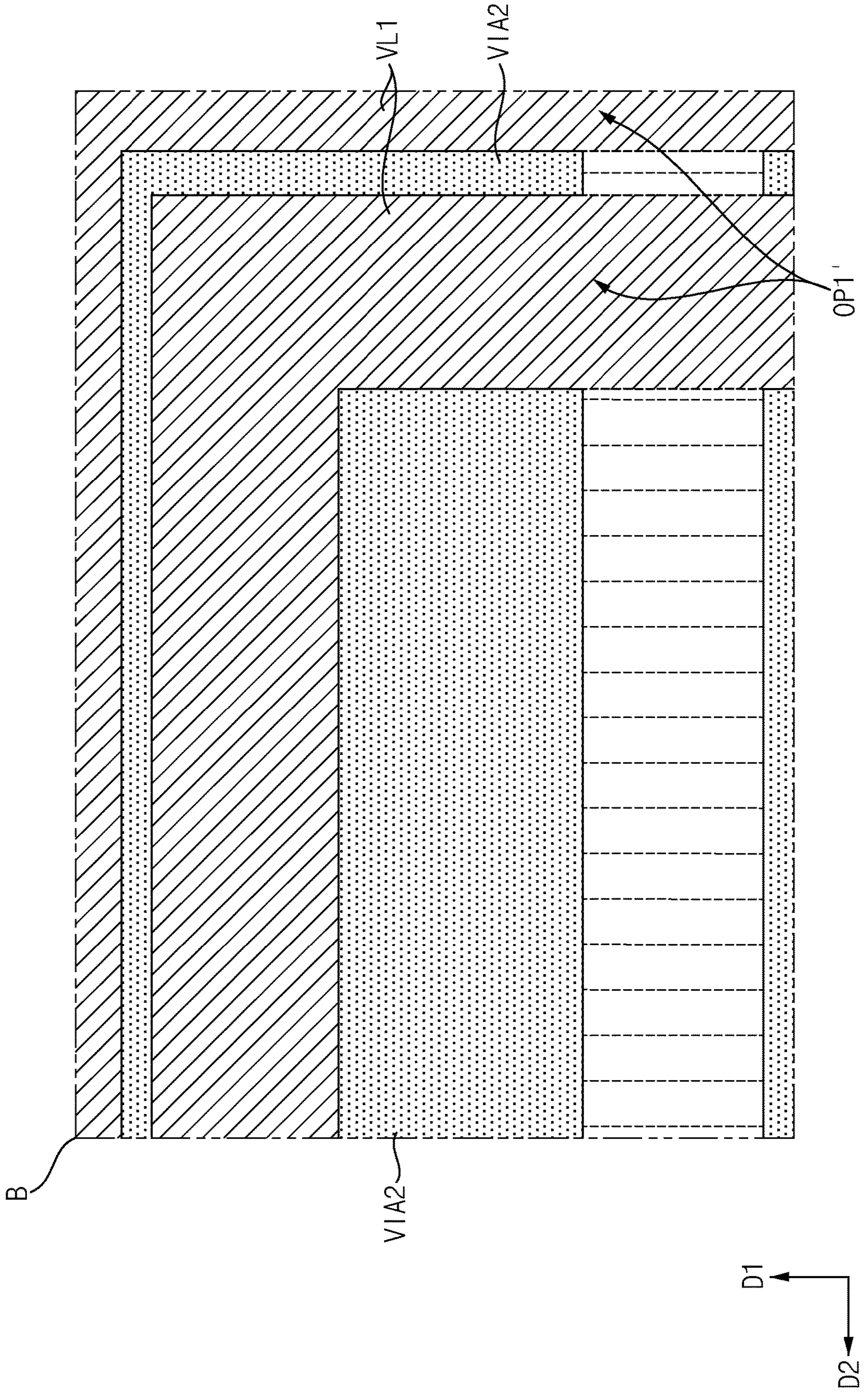

Referring to FIGS. 13 and 14, a second via insulating layer VIA2 may be disposed on the first power supply line VL1 and partially removed.

In an embodiment, the second via insulating layer VIA2 may be partially removed to define an opening OP1' exposing at least a portion of the first power supply line VL1. For example, the opening OP1' defined in the second via insulating layer VIA2 may overlap the first power supply line VL1. In addition, the second via insulating layer VIA2 may contact at least a portion of the first via insulating layer VIA1.

Figure 15:
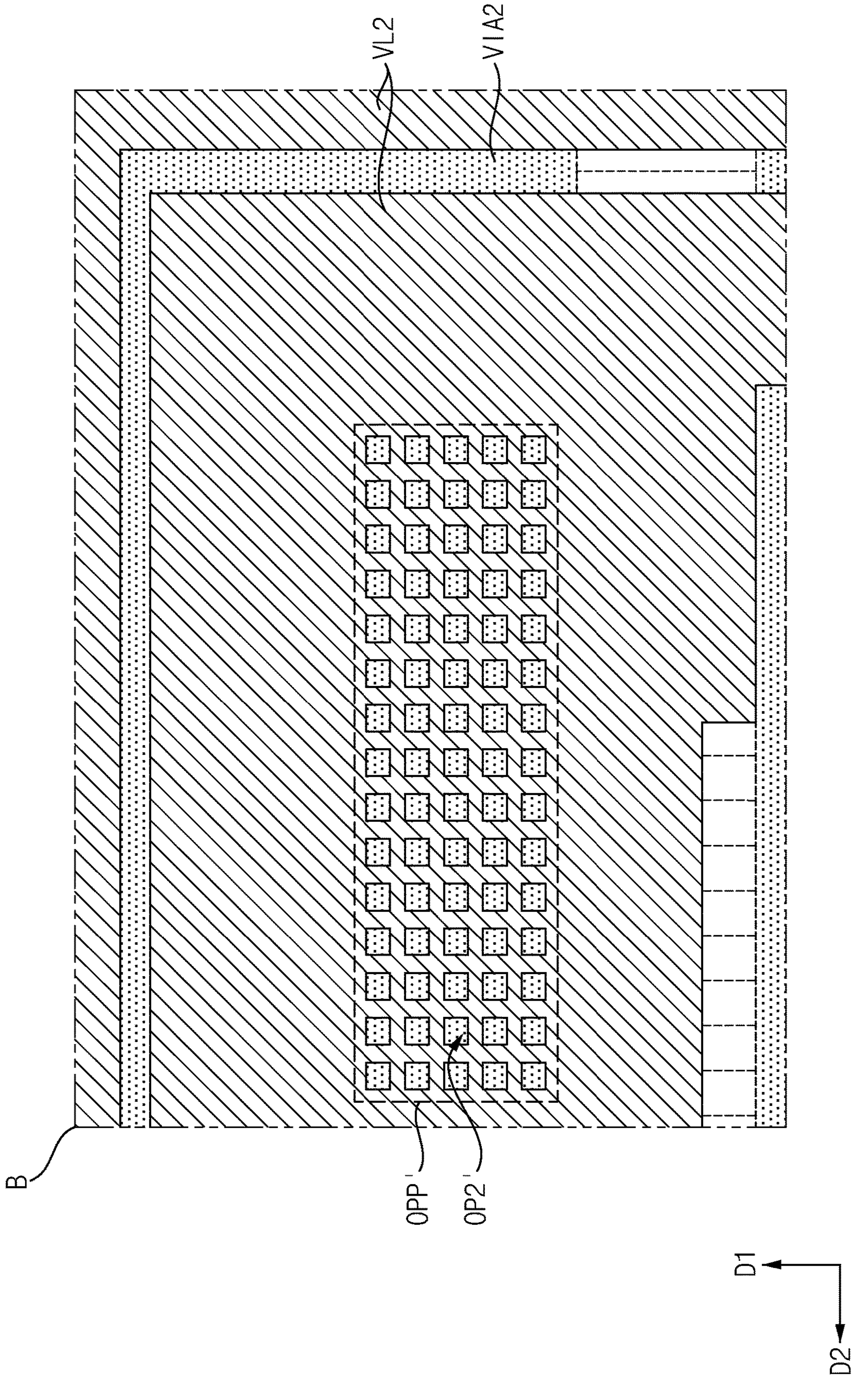

Referring to FIGS. 14 and 15, the second power supply line VL2 may be disposed on the second via insulating layer VIA2.

The second power supply line VL2 may overlap at least a portion of the second via insulating layer VIA2 on the plane. In an embodiment, the second power supply line VL2 may define an opening pattern OPP' exposing the second via insulating layer VIA2 in an area overlapping the second via insulating layer VIA2. The opening pattern OPP' may define a plurality of openings OP2'. For example, the plurality of openings OP2' may be disposed along a first direction D1 and a second direction D2.

As the second power supply line VL2 defines the opening pattern OPP', gas generated in the second via insulating layer VIA2 may be discharged through the opening pattern OPP'.

In addition, the second power supply line VL2 may cover at least a portion of the first power supply line VL1 on the plane. For example, the second power supply line VL2 may contact the first power supply line VL1 through the opening OP1' defined in the second via insulating layer VIA2.

Figure 16:
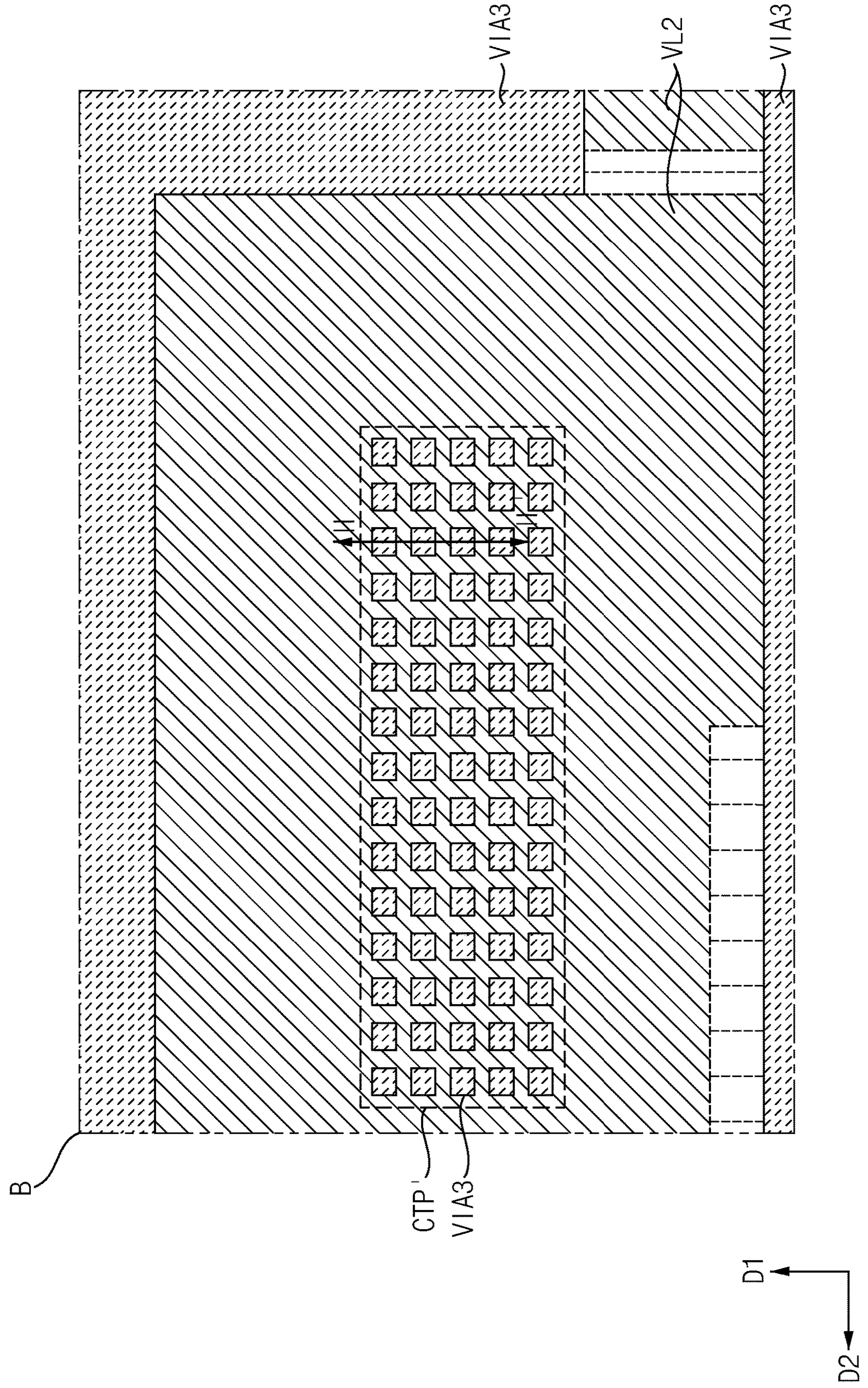

Referring to FIGS. 15 and 16, a third via insulating layer VIA3 may be disposed on the second power supply line VL2.

The third via insulating layer VIA3 may cover at least a portion of each of the second via insulating layer VIA2 and the second power supply line VL2.

In an embodiment, the third via insulating layer VIA3 may include a contact pattern CTP' on at least a portion of the opening pattern OPP' defined in the second power supply line VL2. As shown in FIG. 16, the contact pattern CTP' refers to a region of the third via insulating layer VIA3 that has portions removed. The removed portions may be arranged in a matrix pattern, as in the embodiment of FIG. 16. For example, the third via insulating layer VIA3 may fill the opening pattern OPP' of the second power supply line VL2. That is, the third via insulating layer VIA3 may contact the second via insulating layer VIA2 in the opening pattern OPP'. Although the shape of the removed portions that form the contact pattern CTP' is depicted as rectangular in FIG. 16 for simplicity, this is not a limitation of the disclosure.

The third via insulating layer VIA3 may include an organic insulating material. Examples of organic insulating materials that may be used as the third via insulating layer VIA3 may include photoresist, polyacrylic resin, polyimide resin, acrylic resin, and the like. These may be used alone or in combination with each other.

Figure 17:
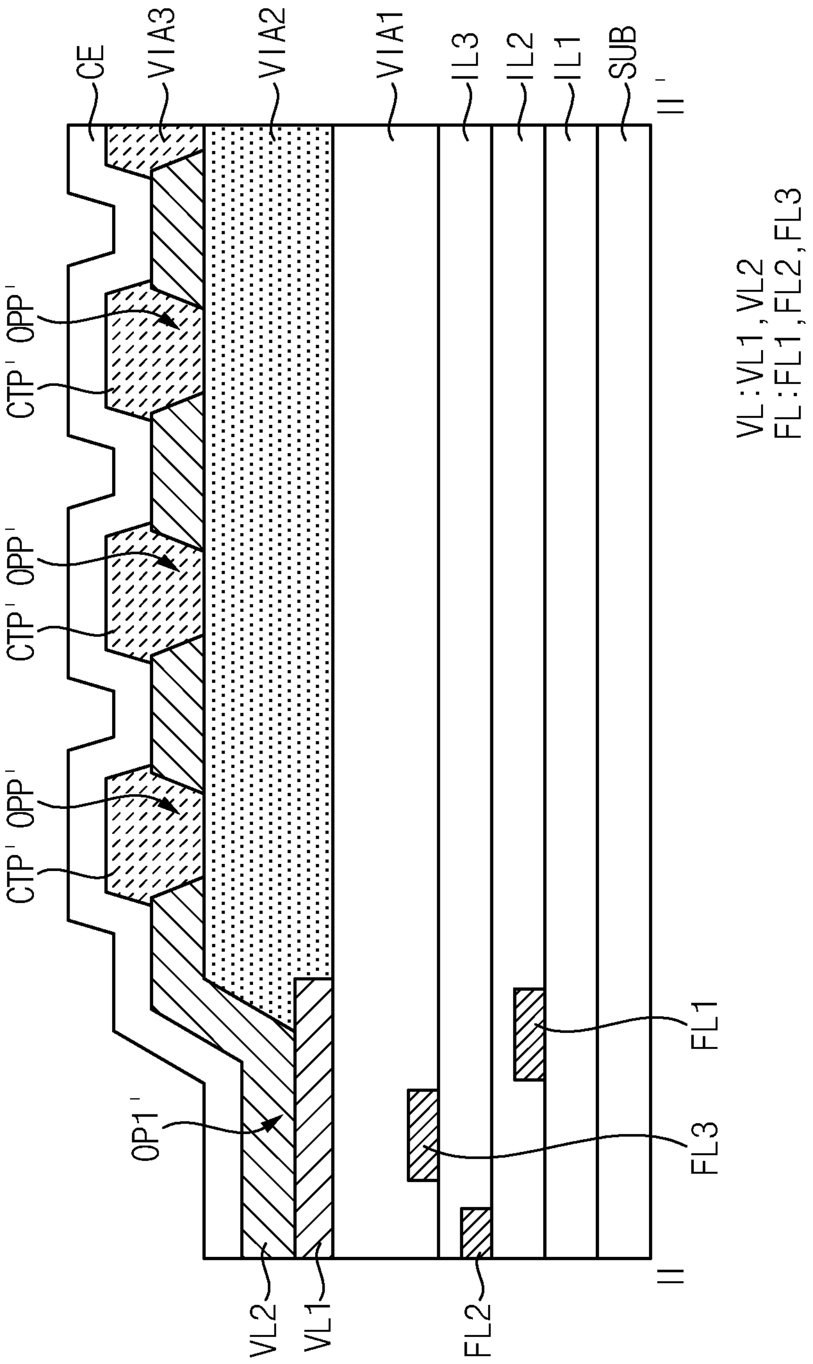
FIG. 17 is a cross-sectional view taken along line II-II' of FIG. 16.

FIG. 17 is a cross-sectional view taken along line II-II' of FIG. 16.

Referring to FIG. 17, the display device 20 may include the substrate SUB, the first insulating layer IL1, the first fan-out line FL1, the second insulating layer IL2, the second fan-out line FL2, the third insulating layer IL3, the third fan-out line FL3, the first via insulating layer VIA1, the first power supply line VL1, the second via insulating layer VIA2, the second power supply line VL2, the third via insulating layer VIA3 and a common electrode CE.

Hereinafter, redundant descriptions of the display device 20 described with reference to FIGS. 10, 11, 12, 13, 14, 15 and 16 will be omitted or simplified.

The first insulating layer IL1, the first fan-out line FL1, the second insulating layer IL2, the second fan-out line FL2, the third insulating layer IL3, the third fan-out line FL3 and the first via insulating layer VIA1 may be sequentially disposed on the substrate SUB. The first fan-out line FL1, the second fan-out line FL2 and the third fan-out line FL3 may be spaced apart from each other.

The first power supply line VL1 and the second via insulating layer VIA2 may be sequentially disposed on the first via insulating layer VIA1. The opening OP1' exposing at least a portion of the first power supply line VL1 may be defined in the second via insulating layer VIA2.

The second power supply line VL2 may be disposed on the second via insulating layer VIA2. The second power supply line VL2 may define the opening pattern OPP' exposing at least a portion of the second via insulating layer VIA2. The second power supply line VL2 may contact the first power supply line VL1 in the opening OP1' of the second via insulating layer VIA2.

The third via insulating layer VIA3 may be disposed on the second power supply line VL2. The third via insulating layer VIA3 may include the contact pattern CTP' overlapping at least a portion of the opening pattern OPP'. The contact pattern CTP' may contact the second via insulating layer VIA2. That is, the third via insulating layer VIA3 may contact the second via insulating layer VIA2 in the opening pattern OPP'. The contact pattern CTP' may prevent corrosion of the second power supply line VL2 by the opening pattern OPP'.

The common electrode CE may be disposed on the third via insulating layer VIA3. The common electrode CE may contact the second power supply line VL2 exposed by the third via insulating layer VIA3. In other words, the common electrode CE may contact the second power supply line VL2 that is not covered by the contact pattern CTP' of the third via insulating layer VIA3.

The display device 20 according to an embodiment of the present disclosure may include the first power supply line VL1, the second via insulating layer VIA2 defining the opening OP1', the second power supply line VL2 defining the opening pattern OPP' and the third via insulating layer VIA3 including the contact pattern CTP'. The second power supply line VL2 may also be disposed in an area where the first power supply line VL1 is not disposed, and may have a relatively large area. In addition, the second power supply line VL2 may overlap and extend with the second via insulating layer VIA2 and the first power supply line VL1 in the first direction D1. Accordingly, power voltage may be sufficiently supplied through the second power supply line VL2. In addition, since the second power supply line VL2 defines the opening pattern OPP', a light emitting element may be prevented from being damaged by the gas generated in the second via insulating layer VIA2. In addition, a distance between the second power supply line VL2 and the fan-out line FL may be relatively large. Accordingly, parasitic capacitance may be prevented, and influence of the second power supply line VL2 on the fan-out line FL may be prevented.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:

a substrate defining a display area and a non-display area adjacent to the display area;

a first line disposed in the non-display area on the substrate;

a first via insulating layer disposed on the first line and defining a first opening positioned on at least a portion of the first line;

a second line disposed on the first via insulating layer and defining an opening pattern positioned on the first via insulating layer and comprising a plurality of second openings; and a second via insulating layer disposed on the second line and including a contact pattern positioned on at least a portion of the opening pattern of the second line, wherein all of the plurality of second openings do not overlap the first line in plan view.

2. The display device of claim 1, wherein the first opening defined in the first via insulating layer in the non-display area is positioned on the first line.

3. The display device of claim 1, wherein the second via insulating layer fills the opening pattern.

4. The display device of claim 3, wherein the second via insulating layer contacts the first via insulating layer in the opening pattern.

5. The display device of claim 1, wherein the second line is positioned on at least a portion of the first line.

6. The display device of claim 1, wherein the second line contacts the first line through the first opening defined in the first via insulating layer.

7. The display device of claim 1, further comprising:

a fan-out line disposed in the non-display area on the substrate and positioned on the first line.

8. The display device of claim 7, wherein the fan-out line includes:

a first fan-out line; and a second fan-out line disposed on the first fan-out line and spaced apart from the first fan-out line in plan view.

9. The display device of claim 1, further comprising:

a common electrode disposed on the second via insulating layer.

10. The display device of claim 9, wherein the common electrode contacts the second line through the contact pattern defined in the second via insulating layer.

11. A display device comprising:

a substrate defining a display area and a non-display area adjacent to the display area;

a plurality of fan-out lines disposed in the non-display area on the substrate;

a first power supply line disposed on the plurality of fan-out lines and positioned on at least a portion of the plurality of fan-out lines;

a first via insulating layer disposed on the first power supply line and defining a first opening that is positioned on at least a portion of the first power supply line;

a second power supply line disposed on the first via insulating layer and defining an opening pattern positioned on the first via insulating layer and comprising a plurality of second openings; and a second via insulating layer disposed on the second power supply line and including a contact pattern positioned on at least a portion of the opening pattern of the second power supply line, wherein all of the plurality of second openings do not overlap the first power supply line in plan view.

12. The display device of claim 11, wherein the plurality of fan-out lines includes a first fan-out line, a second fan-out line disposed on the first fan-out line, and a third fan-out line disposed on the second fan-out line.

13. The display device of claim 12, wherein the first, second and third fan-out lines are spaced apart from each other in plan view.

14. The display device of claim 13, further comprising:

an insulating layer disposed between the third fan-out line and the first power supply line.

15. The display device of claim 14, wherein the insulating layer includes an organic insulating material.

16. The display device of claim 11, wherein the first opening defined in the first via insulating layer in the non-display area is positioned on the first power supply line.

17. The display device of claim 11, wherein the second via insulating layer fills the opening pattern.

18. The display device of claim 17, wherein the second via insulating layer contacts the first via insulating layer through the opening pattern.

19. The display device of claim 11, wherein the second power supply line is positioned on at least a portion of the first power supply line.

20. The display device of claim 11, wherein the second power supply line contacts the first power supply line through the first opening defined in the first via insulating layer.

* * * * *